(12) United States Patent
Mishima

(10) Patent No.: US 7,986,396 B2
(45) Date of Patent: Jul. 26, 2011

(54) EXPOSURE APPARATUS

(75) Inventor: Kazuhiko Mishima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 454 days.

(21) Appl. No.: 11/840,453

(22) Filed: Aug. 17, 2007

(65) Prior Publication Data

US 2008/0049203 A1    Feb. 28, 2008

(30) Foreign Application Priority Data

Aug. 28, 2006  (JP) ................. 2006-230617

(51) Int. Cl.
  *G01B 11/00*  (2006.01)
  *G03B 27/32*  (2006.01)
  *G03B 27/42*  (2006.01)
  *G03B 27/52*  (2006.01)
  *G03B 27/58*  (2006.01)
  *G03B 27/62*  (2006.01)

(52) U.S. Cl. ................ 355/55; 355/53; 355/72; 355/75; 355/77; 399/400; 399/401

(58) Field of Classification Search .............. 250/548, 250/492.2; 257/797; 355/53, 55, 72, 75, 355/77, 67–68; 356/399–401; 382/151; 430/5, 22, 30; 438/401
See application file for complete search history.

(56) References Cited

U.S. PATENT DOCUMENTS

| | | | | |
|---|---|---|---|---|
| 6,023,320 | A | * | 2/2000 | Kawashima ............. 355/53 |
| 6,870,623 | B2 | | 3/2005 | Tanaka et al. |
| 7,193,685 | B2 | | 3/2007 | Miura |
| 2004/0165195 | A1 | | 8/2004 | Sato et al. |
| 2005/0002035 | A1 | | 1/2005 | Mishima |
| 2005/0128453 | A1 | * | 6/2005 | Miura ....................... 355/55 |
| 2005/0146693 | A1 | | 7/2005 | Ohsaki |
| 2007/0052113 | A1 | * | 3/2007 | Marokkey et al. ........ 257/797 |

FOREIGN PATENT DOCUMENTS

JP     2005-175400 A    6/2005

* cited by examiner

*Primary Examiner* — Hung Henry Nguyen
*Assistant Examiner* — Colin Kreutzer
(74) *Attorney, Agent, or Firm* — Canon U.S.A., Inc., IP Division

(57) ABSTRACT

An exposure apparatus includes a projection optical system that projects a pattern image of an original onto a substrate, an original stage that holds and drives the original, a substrate stage that holds and drives the substrate, and a position detecting system that detects the relative positional relationship between position detection marks formed on the original or the original stage and fiducial marks formed on the substrate stage. The position detection marks form a plurality of mark groups arranged in a first direction. Each of the plurality of mark groups has a first mark for measuring the position in the first direction and a second mark for measuring the position in a second direction perpendicular to the first direction. The position detecting system has a plurality of photoelectric conversion elements, which simultaneously detect a plurality of the first marks or a plurality of the second marks.

7 Claims, 13 Drawing Sheets

EXPOSURE APPARATUS

BACKGROUND OF THE INVENTION

1. Field of the Invention

The present invention generally relates to an exposure apparatus, and more specifically, it relates to an exposure apparatus that performs alignment of an original and a substrate with high precision.

2. Description of the Related Art

Along with the recent remarkable development of device (semiconductor devices, liquid crystal devices, and so forth) manufacturing techniques, the progress of micropatterning techniques is also prominent. Particularly in the lithography process, exposure apparatuses having submicron resolutions are mainstream. For higher resolutions, a larger numerical aperture (NA) of a projection optical system and a shorter exposure light wavelength are being realized.

There are exposure apparatuses in which the space between a wafer and a projection optical system is filled with liquid, and the wafer is exposed through the liquid in order to improve resolution and focal depth.

With the improvement of resolution of projection optical systems, high precision is required for the relative alignment between a wafer and a reticle (mask) in an exposure apparatus. That is to say, exposure apparatuses are required to have a function as a high-precision position detecting apparatus.

High throughput is also an important function of exposure apparatuses. Twin stage type exposure apparatuses, which have two stages, achieve this function.

Twin stage type exposure apparatuses have at least two spaces, a measurement space where the position of a wafer is detected, and an exposure space where the exposure is performed based on the measurement result. The two stages are alternated between the measurement space and the exposure space.

In the measurement space is provided an alignment detection system, which optically detects an alignment mark on the wafer. The positional information of the alignment mark is obtained from the alignment detection system, and the exposure position of the wafer in the exposure space is determined. When a stage moves from the measurement space to the exposure space, the position of the stage needs to be controlled. Therefore, on each stage is disposed a fiducial mark.

In the measurement space, the fiducial mark is detected by the alignment detection system, and the relative position of the alignment mark on the wafer to the fiducial mark is measured. Thereafter, the stage moves to the exposure space. The relative positional relationship between the reticle and the fiducial mark is detected in the exposure space. The relative positional relationship between the measurement space and the exposure space is thereby ensured. Therefore, in twin stage type exposure apparatuses, it is necessary to detect the fiducial mark on the stage in the two spaces, the measurement space and the exposure space.

After completion of exposure of the wafer, the stage is moved to the measurement space, and the position detection of the next wafer and the position detection of the fiducial mark are performed. As described above, in the case where a plurality of wafers are exposed, the detection of the fiducial mark is repeatedly performed in the measurement space, then in the exposure space, then in the measurement space.

A method for detecting the position of a fiducial mark in the exposure space is proposed in US2005/0146693 and Japanese Patent Laid-Open No. 2005-175400. In the method, a fiducial mark is used that has portions transmitting exposure light (light-transmitting portions) and portions opaque to exposure light (light-shielding portions), and the position is detected from the amount of light passing through the light-transmitting portions. On the reticle is provided a mark similar to the fiducial mark, and the mark is illuminated with exposure light. An image of the mark on the reticle is formed on the fiducial mark on the wafer stage by a projection optical system. The position of the fiducial mark in the optical axis direction of the projection optical system and the directions perpendicular to the optical axis is changed relative to the image of the mark on the reticle. Thereby, the amount of the exposure light passing through the light-transmitting portions of the fiducial mark changes. From the change profile, the relative positional relationship between the reticle and the wafer stage can be measured.

Such relative alignment between the reticle and the wafer stage can be used not only in twin stage type exposure apparatuses but also in conventional single stage type exposure apparatuses. In that case, it is used for measuring the relative positional relationship (so-called base line) between an off-axis alignment detection system detecting an alignment mark on a wafer and a projection optical system.

From the viewpoint of improving the throughput, the amount of time for measuring the relative positional relationship between the reticle and the wafer stage or measuring the base line needs to be minimized.

Particularly in twin stage type exposure apparatuses, since the measurement of the fiducial mark needs to be performed for every wafer, the amount of time for measuring the relative positional relationship between the reticle and the wafer stage significantly influences the throughput.

The rotation component of the reticle and the wafer and the magnification component of the reticle can also be measured using the fiducial mark. When these components are measured, however, the throughput is also reduced.

FIGS. 13A to 13C schematically show marks (calibration marks) on a reticle and fiducial marks of a wafer stage according to a conventional art. On the reticle 2 are provided, as shown in FIG. 13A, calibration marks 601 and 603 for measuring the position in the X direction and calibration marks 602 and 604 for measuring the position in the Y direction.

FIG. 13C shows fiducial marks provided on the wafer stage and viewed from the Z direction (the optical axis direction of the projection optical system). On the wafer stage are provided a fiducial mark 605 corresponding to the calibration marks 601 and 603, and a fiducial mark 606 corresponding to the calibration marks 602 and 604.

FIG. 13B schematically shows the fiducial marks viewed from a direction perpendicular to the optical axis. In FIG. 13B, light-transmitting portions (openings) 32a and 32b, which are formed through a light-shielding portion 31, correspond to the fiducial marks 605 and 606, respectively. Light beams passing through the light-transmitting portions 32a and 32b are incident on the photoelectric conversion elements 30a and 30b. The photoelectric conversion elements 30a and 30b measure the amounts of the light beams. Even if light beams fall on the light-transmitting portions 32a and 32b simultaneously, the photoelectric conversion elements 30a and 30b can separately detect the light beams.

As described above, according to the conventional art, two pairs of calibration marks 601 and 602, and 603 and 604 corresponding to the fiducial marks 605 and 606 are provided on the reticle 2. A pair of fiducial marks 605 and 606 is moved to measure the position of each of the two pairs of calibration marks on the reticle 2. Therefore, the pairs of calibration marks 601 and 602, and 603 and 604 on the reticle 2 are configured so that the two kinds of marks are arranged in the same order corresponding to the order of arrangement of the fiducial marks 605 and 606.

The rotation component of the reticle 2 is measured, for example, from the difference value between the positions in the Y direction of the Y direction marks 602 and 604 provided in two places on the reticle 2. When the distance between the two Y marks is L, and the difference value is $\Delta Y$, the rotation component $\theta = \Delta Y / L$. Therefore, L is maximized to improve the measurement precision.

In the conventional art, the same kinds of marks 602 and 604 are provided on the left and right of the reticle, and the wafer stage is driven to measure the rotation component with the corresponding fiducial mark 606. Therefore, the measurement takes time. In addition, the fiducial marks 605 and 606 need to be disposed so that the distance therebetween is greater than or equal to the size of the photoelectric conversion elements 30a and 30b. Therefore, the distance L between the calibration marks 602 and 604 provided on the reticle 2 is small. As described above, when the distance L is small, the measurement precision of the rotation component is prevented from being improved.

SUMMARY OF THE INVENTION

The present invention is directed to an exposure apparatus capable of measuring the relative positional relationship between a substrate stage and an original or an original stage, without significantly reducing throughput, with higher precision.

In an aspect of the present invention, an exposure apparatus includes a projection optical system that projects a pattern image of an original onto a substrate, an original stage that holds and drives the original, a substrate stage that holds and drives the substrate, and a position detecting system that detects the relative positional relationship between position detection marks formed on the original or the original stage and fiducial marks formed on the substrate stage. The position detection marks form a plurality of mark groups arranged in a first direction. Each of the plurality of mark groups has a first mark for measuring the position in the first direction and a second mark for measuring the position in a second direction perpendicular to the first direction. The position detecting system has a plurality of photoelectric conversion elements. The plurality of photoelectric conversion elements simultaneously detect a plurality of the first marks or a plurality of the second marks.

Further features and aspects of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
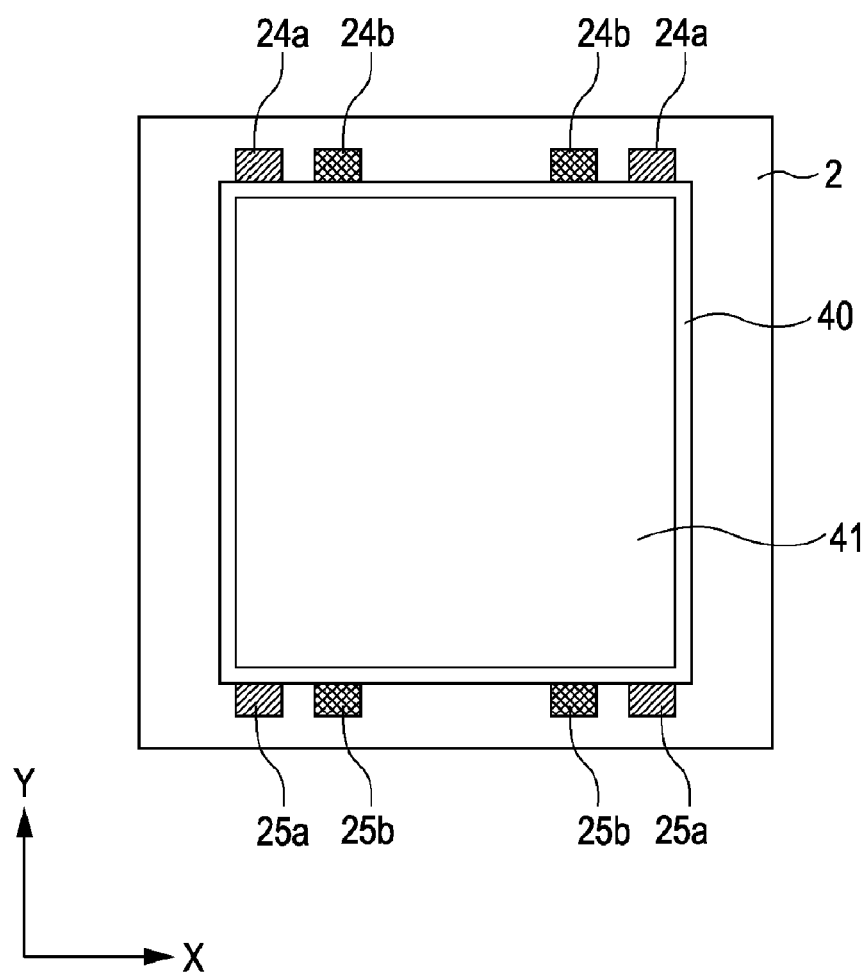
FIG. 1 shows an example reticle having calibration marks, according to an aspect of the present invention.

Exemplary embodiments according to the present invention will hereunder be described in detail with reference to the attached drawings. In the figures, corresponding parts are given the same reference numerals, and the same descriptions of the corresponding parts will not be repeated.

In embodiments of the present invention, fiducial marks are provided on a wafer stage (substrate stage) on which a wafer (photosensitive substrate) is placed, and correspondingly thereto, a plurality of calibration marks (position detection marks) are provided on a reticle (original) or a reticle stage (original stage). The relative positional relationship between these fiducial marks and the plurality of calibration marks is detected. Based on the detection result, the relative positional relationship between the reticle or the reticle stage and the wafer stage is calculated. In addition, by devising the arrangement of the plurality of calibration marks, the relative positional relationship can be calculated with high precision.

Specifically, more calibration marks are provided than the conventional configuration. In addition, the relative positional relationship is detected with fiducial marks and photoelectric conversion elements provided on the wafer side and capable of measuring a plurality of calibration marks separately and simultaneously. By devising the arrangement of the plurality of calibration marks and selecting and measuring appropriate marks, high-precision and high-throughput detection can be performed. The calibration marks include X marks (first marks) capable of measuring the position in an X direction (first direction), and Y marks (second marks) capable of measuring the position in a Y direction (second direction) perpendicular to the X direction.

For example, the calibration marks provided on the reticle form a plurality of first mark groups and a plurality of second mark groups. The arrangement order of the marks in the first mark groups is different from that in the second mark groups. By using these two kinds of mark groups on the reticle according to correction items (magnification, rotation, and so forth), high-precision and high-throughput measurement can be performed. Each first mark group includes an X mark and a Y mark arranged in this order (predetermined order) in the X direction, whereas each second mark group includes a Y mark and an X mark arranged in this order (in the reverse order of the predetermined order) in the X direction.

If there is no need to improve the precision of all of the correction items, at least three first mark groups or at least three second mark groups arranged in the X direction suffice.

The embodiments of the present invention will now be described with reference to the drawings.

First Exemplary Embodiment

An example single stage type exposure apparatus will now be described with reference to FIG. 4. An illumination system 1 emits exposure light. Light emitted from the illumination system 1 illuminates a reticle 2 serving as an original. The reticle 2 is positioned by a reticle alignment scope 11, which can simultaneously observe reticle set marks 12 and 12' on a reticle stage.

The light passing through a circuit pattern on the reticle 2 passes through a projection optical system 3 and forms an image of the pattern on a wafer 6 serving as a photosensitive substrate. The wafer 6 is held on a wafer stage 8, which can be driven in the X, Y, Z, and rotation directions. On the wafer stage 8 is provided a fiducial mark group 15 for measuring the below-described base line.

On the wafer 6 is provided alignment marks. The positions of the alignment marks are measured by a position detecting device 4 serving as a position detecting system. The position of the wafer stage 8 is always measured by an interferometer 9 using a mirror 7. The arrangement information of chips formed on the wafer 6 is calculated by a controller 14 from the measurement result of the interferometer 9 and the measurement result of the position detecting device 4.

When the wafer 6 is exposed, the surface of the wafer 6 needs to be aligned with the position where the projection optical system 3 forms the image. Surface position detecting devices 501 to 503 and 505 to 508 detect the position of the surface of the wafer 6 in the optical axis direction (focus direction, Z direction) of the projection optical system 3. Light output from a light source 501 passes through an illuminating lens 502, a slit pattern 503, and a mirror 505, and projects the slit pattern onto the wafer 6 from an oblique direction. The slit pattern projected onto the wafer 6 is reflected on the wafer surface and led by a detecting lens 507 to a photoelectric conversion element 508 such as a CCD sensor. The position of the surface of the wafer 6 can be measured from the position of the image of the slit pattern obtained by the photoelectric conversion element 508.

As described above, the arrangement information of the chips formed on the wafer 6 is detected by the position detecting device 4. Prior to this, it is necessary to obtain the relative positional relationship (base line) between the position detecting device 4 and the projection optical system 3.

[Exemplary Method for Measuring Base Line]

An exemplary method for measuring the base line will now herein be described with reference to FIGS. 1, 2A, 2B, 5, 6A and 6B.

Figure 2A:
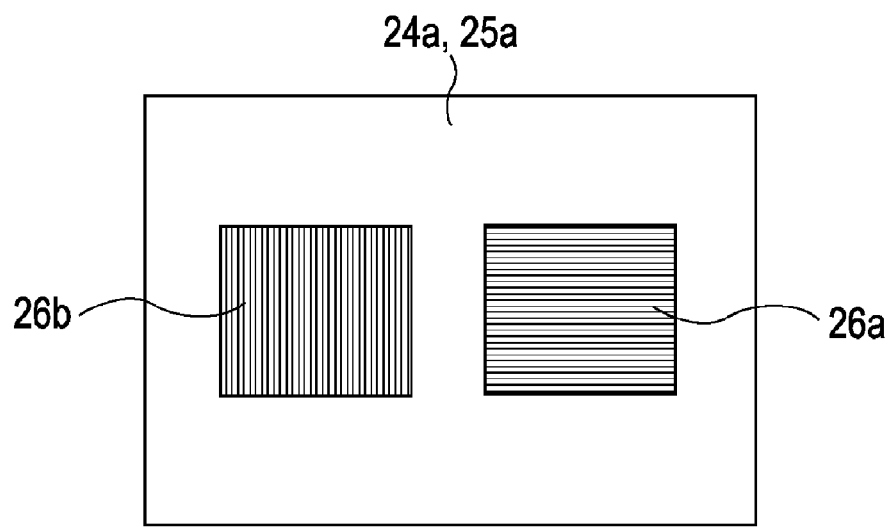
FIGS. 2A and 2B show example calibration marks, according to an aspect of the present invention.
Figure 2B:
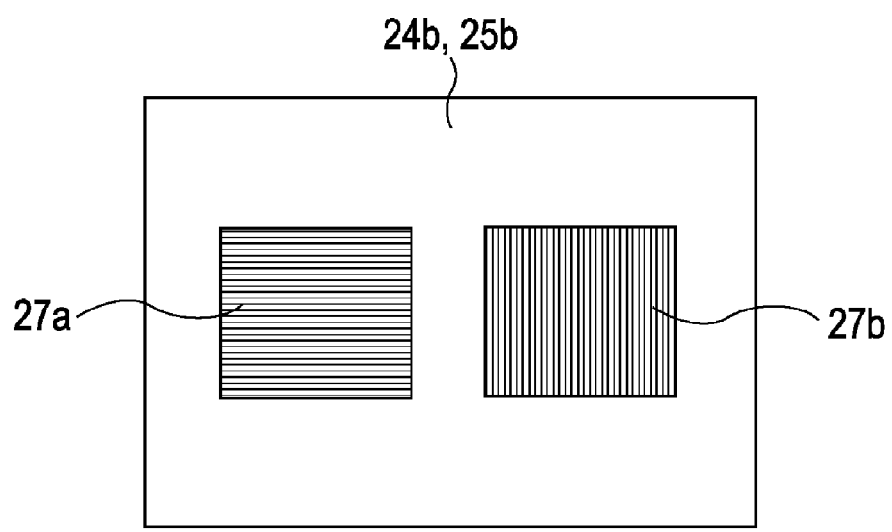

FIG. 1 shows position detection mark groups (hereinafter referred to as "calibration mark groups") 24a, 24b, 25a, and 25b provided on the reticle 2. FIGS. 2A and 2B illustrate in detail the calibration mark groups 24a, 24b, 25a, and 25b shown in FIG. 1. A mark (hereinafter referred to as "calibration mark") 26a (27a) for measuring the Y direction and a calibration mark 26b (27b) for measuring the X direction (see FIG. 2) are arranged in the shown order in the calibration mark groups 24a, 24b, 25a, and 25b. Each calibration mark 26a (27a) is a repeating pattern of light-transmitting portions (openings) and light-shielding portions elongate in the X direction. Each calibration marks 26b (27b) is a repeating pattern of light-transmitting portions (openings) and light-shielding portions elongate in the Y direction perpendicular to the X direction.

In this embodiment, when the XY coordinate system is defined as shown, marks for measuring the X direction or the Y direction is used as calibration marks. However, the present invention is not limited to this. For example, marks for measuring a direction at an angle of 45° or 135° with respect to the X and Y axes can be used. That is to say, the direction of the marks is not limited in the present invention.

Figure 4:
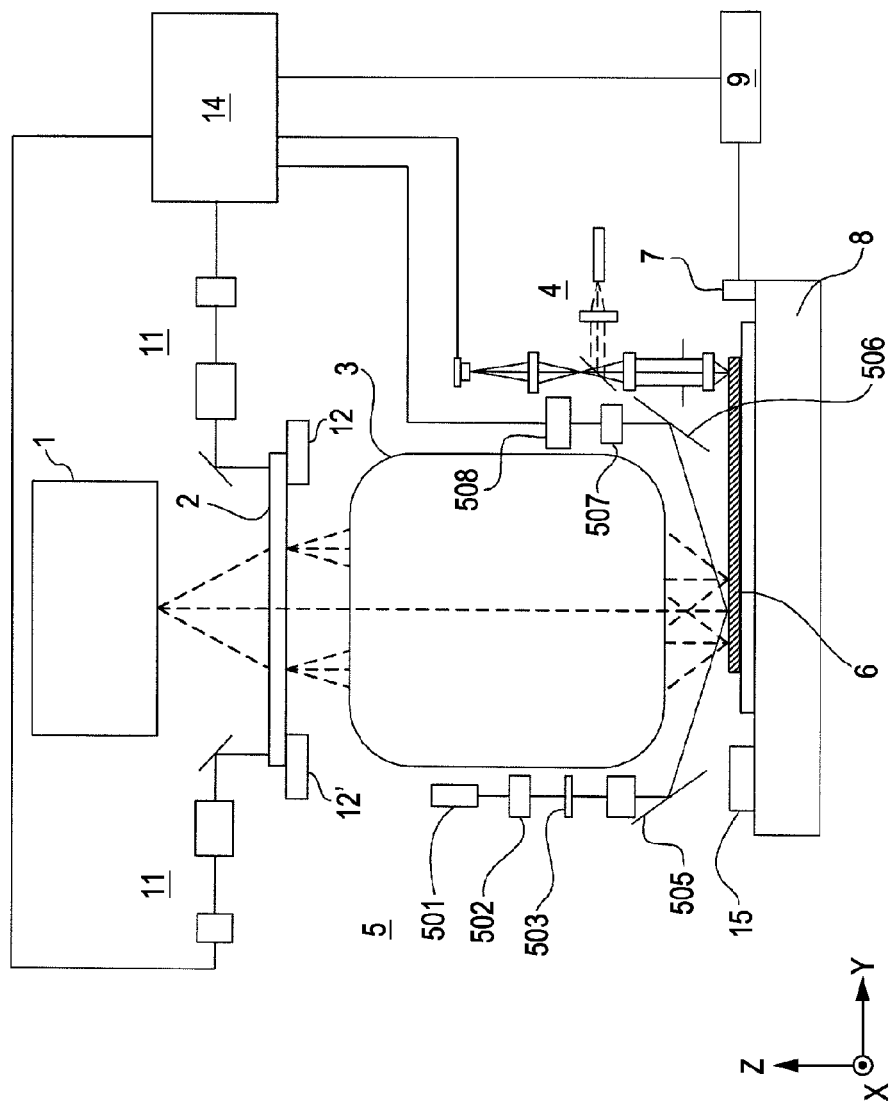
FIG. 4 shows an example of single stage type exposure apparatus, according to an aspect of the present invention.
Figure 5:
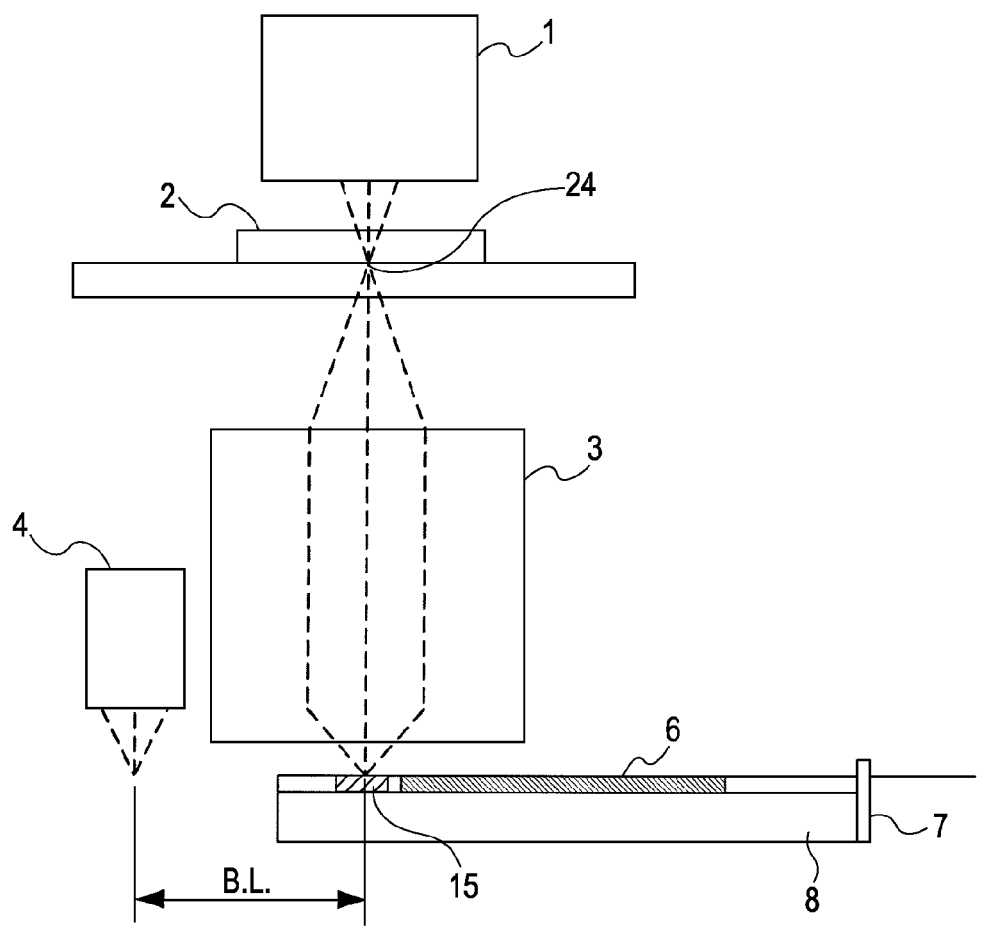
FIG. 5 illustrates the base line in the single stage type exposure apparatus, according to an aspect of the present invention.

The calibration marks 26a, 26b, 27a, and 27b provided on the reticle 2 are illuminated by the exposure light emitted from the illumination system 1 (see FIG. 4). The light-transmitting portions of the calibration marks 26a, 26b, 27a, and 27b transmit light. The projection optical system 3 forms images of the light-transmitting portions at the best focus position on the wafer side.

Figure 6A:
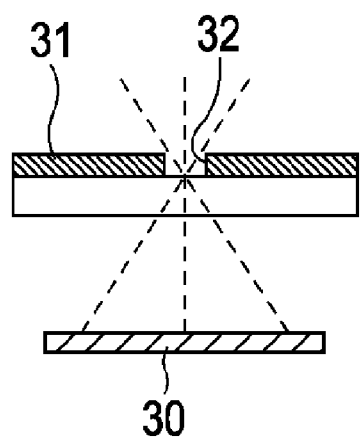
FIG. 6A is a side view of a fiducial mark and a photoelectric conversion element, according to an aspect of the present invention.

On the wafer stage 8 is disposed a fiducial mark group 15. The fiducial mark group 15 will be described in detail with reference to FIGS. 6A and 6B. The fiducial mark group 15 has fiducial marks 22a and 22b of the same size as the images of the above-described calibration marks 26a, 26b, 27a, and 27b on the reticle 2. FIG. 6A shows part of the fiducial mark group 15 viewed from the cross-sectional direction. The fiducial marks 22a and 22b each include light-shielding portions 31 and light-transmitting portions (openings) 32 (only one of the light-transmitting portions is shown in this figure). The light passing through the light-transmitting portion 32 reaches a photoelectric conversion element 30. The amount of the light passing through the light-transmitting portion 32 can be measured with the photoelectric conversion element 30.

On the fiducial mark group 15, in addition to the fiducial marks 22a and 22b corresponding to the calibration marks 26a, 26b, 27a, and 27b, is provided a position measurement mark 21 capable of being detected by the position detecting device 4. The relative positional relationship between the position measurement mark 21 and the fiducial marks 22a and 22b are known. The position measurement mark 21 is driven to the observation region of the position detecting device 4. From the detection result of the position detecting device 4 and the detection result of the interferometer 9 at that time, the position of the position measurement mark 21 is obtained (see FIG. 6B).

Next, a method for obtaining the relative position of the position detecting apparatus 4 to the projection optical system 3 (base line, shown by B.L. in FIG. 5) using the above-described fiducial mark group 15 will be described in detail. First, the calibration marks 26a, 26b, 27c, and 27b provided on the reticle 2 are driven to a predetermined position through which exposure light incident on the projection optical system 3 passes. The calibration mark 26a will be taken as an example because the same is true of the other calibration marks 26b, 27a, and 27b.

The calibration mark 26a driven to the predetermined position is illuminated by exposure light emitted from the illumination system 1. The light passing through the light-transmitting portions of the calibration marks 26a passes through the projection optical system 3. And the projection optical system 3 forms a mark image of the calibration marks 26a on an image plane of the projection optical system 3. The wafer stage 8 is driven so that the fiducial mark 22a, which has the same shape as the mark image, is located at the corresponding position to the mark image. At that time, with the fiducial mark group 15 disposed in the image-forming plane (best focus plane) of the calibration mark 26a, the fiducial mark 22a is driven in the Y direction, and the output value of the photoelectric conversion element 30 is monitored.

Figure 10:
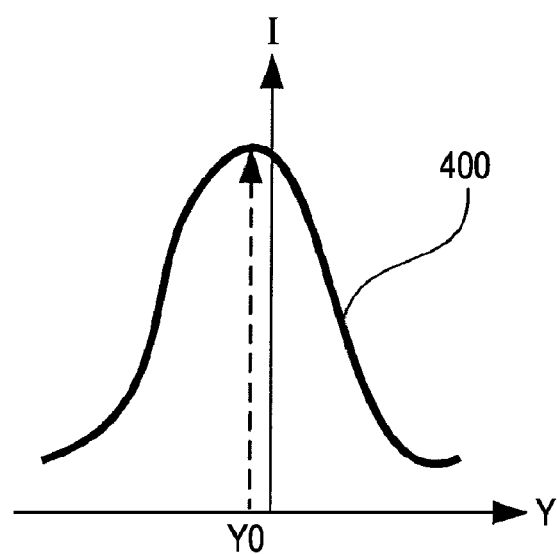
FIG. 10 shows the change in the amount of light passing through a fiducial mark, according to an aspect of the present invention.

FIG. 10 shows a schematic graph on which the position of the fiducial mark 22a in the Y direction and the output value of the photoelectric conversion element 30 are plotted. In FIG. 10, the horizontal axis represents the position of the fiducial mark 22a in the Y direction, and the vertical axis represents the output value of the photoelectric conversion element 30. As shown, when the relative positional relationship between the calibration mark 26a and the fiducial mark 22a is changed, the obtained output value also changes. The output value is the greatest at the position (Y0) where the images of the light-transmitting portions of the calibration mark 26a correspond to the light-transmitting portions of the fiducial mark 22a. By obtaining this position Y0, the position of the image of the calibration mark 26a formed by the projection optical system 3 can be obtained. The position Y0 can be detected by performing centroid computation or functional approximation in a predetermined region of the obtained change curve 400 and thereby obtaining the peak position.

The measurement using the calibration mark 26a is described above. Similarly, the positions of the images of the calibration marks 26b, 27a, and 27b formed by the projection optical system 3 can be detected using the fiducial marks 22a or 22b corresponding to the calibration marks 26b, 27a, and 27b.

In the above description, it is assumed that the fiducial mark group 15 is located in the best focus plane of the image of the calibration mark. However, in an actual exposure apparatus, the relative position in the optical axis direction can be indefinite. In that case, the best focus plane can be obtained by driving the fiducial mark group 15 in the optical axis direction and monitoring the output value of the photoelectric conversion element 30. In that case, in the graph shown in FIG. 10, if it is assumed that the horizontal axis represents the focus position and the vertical axis represents the output value I, the best focus plane can be calculated in a similar manner.

If the fiducial mark group 15 deviates in the X and Y directions and in the Z direction (optical axis direction), measurement is performed from one of the directions and thereafter the position in another direction is detected. By alternately performing the above, the optimum position can eventually be calculated. For example, the fiducial mark group 15 deviating in the Z direction is driven in the X direction. A less accurate measurement in the X direction is performed to calculate the approximate position in the X direction. Thereafter, the fiducial mark group 15 is driven in the Z direction to calculate the best focus plane. Next, by driving the fiducial mark group 15 in the X direction again in the best focus plane and performing measurement, the optimum position in the X direction can be obtained with high precision. Normally, such a single set of alternating measurements suffices for high-precision measurement. In the above example, the measurement from the X direction is first started. However, if the measurement in the Z direction is first started, high-precision measurement is also possible eventually.

As described above, the positions of the images of the calibration marks 26a, 26b, 27a, and 27b in the X and Y directions are calculated, and thereafter the fiducial mark group 15 is driven to the position detecting device 4 side to detect the position of the position measurement mark 21. By using the drive amount of the wafer stage 8 and the detection result of the position detecting device 4, the relative positional relationship (base line) between the projection optical system 3 and the position detecting device 4 can be calculated.

The above base line measurement is performed in a so-called single stage type exposure apparatus having a single wafer stage. In a twin stage type exposure apparatus having two wafer stages, the fiducial mark group 15 is used for the detection by the position detecting device 4 in the measurement space and the detection of the relative position to the calibration mark by the projection optical system 3 in the exposure space.

Figure 8:
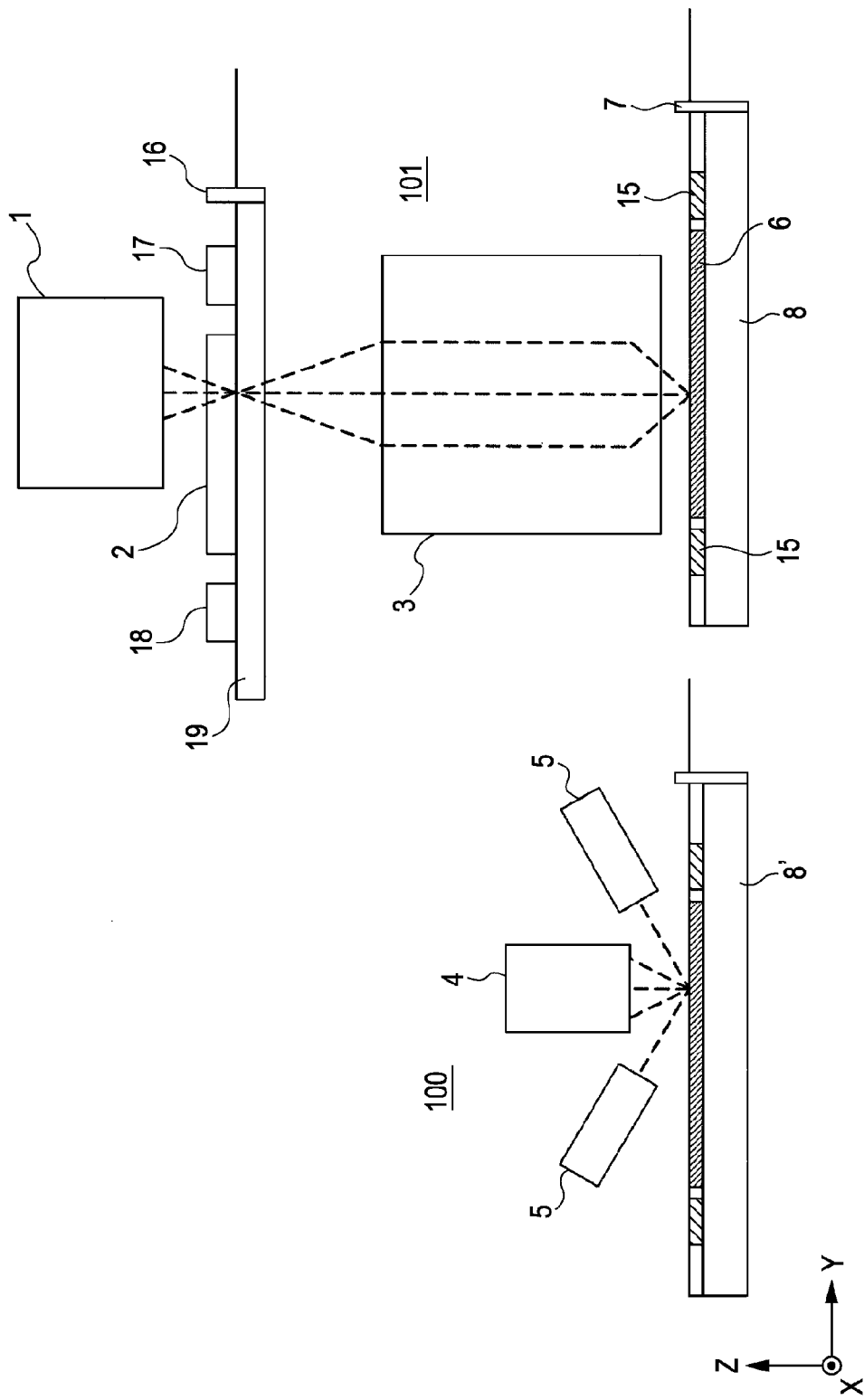
FIG. 8 shows an example twin stage type exposure apparatus, according to an aspect of the present invention.

FIG. 8 schematically shows an example twin stage type exposure apparatus. How to use the fiducial mark group 15 will be specifically described with reference to this figure.

A twin stage type exposure apparatus has two regions, a measurement space 100 where measurement such as alignment of a wafer is performed, and an exposure space 101 where exposure is performed based on the measurement result. Two wafer stages are alternated between the spaces, and measurement and exposure are repeated. The fiducial mark group 15 and so forth provided on the wafer stage 8 are the same as those described above.

In the measurement space 100, the position of the position detection mark 21 on the fiducial mark group 15 is measured by the position detecting device 4. The relative position of an alignment mark provided on the wafer 6 to the position detection mark 21 is detected by the position detecting device 4 in a similar manner, and the arrangement information of chips formed on the wafer 6 is calculated. That is to say, the arrangement information of the chips relative to the fiducial mark group 15 is measured and stored in a storage unit such as a memory. The position of the surface of the wafer 6 in the Z direction is detected as the height of the surface of the wafer 6 relative to the position of the fiducial mark group 15 in the Z direction. Specifically, the position of the fiducial mark group 15 in the Z direction is detected by a surface position detecting device 5. Next, the wafer stage 8' is driven in the X and Y directions, and the position of the whole surface of the wafer 6 in the Z direction is measured by the surface position detecting device 5. The measurement value is obtained as the position of the wafer 6 in the Z direction relative to the position of the wafer stage 8' in the X and Y directions and is stored in the storage unit. To calculate the position in the Z direction relative to the position in the X and Y directions will hereinafter be referred to as focus mapping. This focus mapping is also performed with reference to the position of the fiducial mark group 15 in the Z direction.

As described above, in the measurement space 100, both the arrangement information of the chips and the focus mapping information are obtained relative to the fiducial mark group 15. Without changing the relative positional relationship between the fiducial mark group 15 and the wafer, the wafer stage 8' is moved to the exposure space.

Next, the relative positional relationship between the fiducial mark group 15 provided on the wafer stage 8 and the calibration mark provided on the reticle 2 is obtained. The calculating method is the same as the above-described method. By obtaining the relative positional relationship (in the X, Y, and Z directions) between the reticle 2 and the fiducial mark group 15, since the relative position of the wafer 6 to the fiducial mark group 15 is already obtained in the measurement space, the relative positional information between the reticle 2 and each chip on the wafer 6 is obtained. Based on the information, exposure operation is started.

In the above description, it is assumed that the calibration marks 26a, 26b, 27a, and 27b are provided on the reticle 2. However, the present invention is not limited to this. For example, if the reticle stage 19 is also drivable, the calibration marks 26a, 26b, 27a, and 27b can be provided on reticle fiducial plates 17 and 18 fixed to the reticle stage 19. The reticle fiducial plates 17 and 18 are formed of the same material as the reticle 2 and are fixed at positions different from the place where the reticle 2 is disposed. As in the case of the wafer stage 8, the position of the reticle stage 19 is always measured by an interferometer using a mirror 16.

In the case where a reticle fiducial plate 19 is used, by measuring the relative position to the fiducial mark group 15, the optical performance (aberration) of the projection optical system 3 can also be calculated. The reason is that since the measurement is performed using the same reticle fiducial plate, the change over time can be easily seen, and the drawing precision of the pattern of the reticle 2 can be excluded.

As described above, as in the single stage type exposure apparatus, also in the twin stage type exposure apparatus, the calibration marks 26a, 26b, 27a, and 27b provided on the reticle 2 and the fiducial marks 22 on the fiducial mark group 15 are used, and the relative positional relationship therebetween is detected.

In the case of the single stage type exposure apparatus, if the relative positional relationship between the projection optical system 3 and the position detecting device 4 is stable, a single measurement of the calibration marks suffices.

Figure 6B:
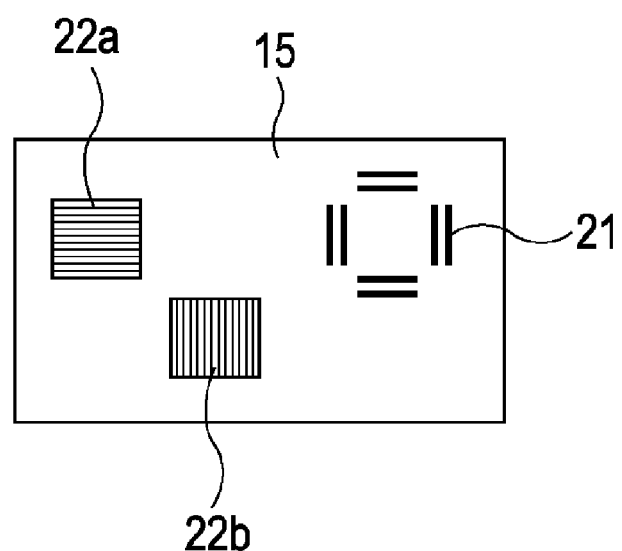
FIG. 6B is a top plan view of a fiducial mark group, according to an aspect of the present invention.

On the other hand, in the case of the twin stage type exposure apparatus, when the wafer stage 8 is moved from the measurement space to the exposure space, the position of the wafer stage 8 can be indefinite (not satisfy necessary precision). In such a case, the measurement of the calibration marks is required for each of a plurality of wafers 6. Therefore, from the viewpoint of throughput, the amount of time for the measurement of the calibration marks is desired to be minimized. In particular, in the case where the rotation position of the wafer stage 8 is desired to be aligned with the attitude of the reticle 2, it is necessary to measure the calibration marks provided at a plurality of positions on the reticle 2. If, as in the conventional art, the calibration marks are measured at different times, the throughput is reduced. Therefore, they are desired to be measured simultaneously. For this purpose, instead of disposing a single X mark (or Y mark) as a fiducial mark as shown in FIG. 6B, it is necessary to dispose a plurality of X marks (or Y marks) as fiducial marks and a plurality of photoelectric conversion elements corresponding thereto, at the positions corresponding to a plurality of X marks (or Y marks) provided as calibration marks at a plurality of positions on the reticle 2.

The configuration of the fiducial mark group 15 and the photoelectric conversion elements 30 and the corresponding arrangement condition of the calibration marks on the reticle 2 required when high throughput is considered will be described. In this embodiment will be disclosed the arrangement of calibration marks suitable for achieving high throughput.

Attention will now be returned to FIGS. 1 and 2, and the arrangement of the calibration marks will be described. In FIG. 1, inside a light-shielding zone 40 is provided an exposure area 41 where a circuit pattern is formed. Around the light-shielding zone 40 are provided calibration mark groups 24a, 24b, 25a, and 25b. They are disposed on the positive side and the negative side of the Y axis, which is parallel to the scanning direction. In addition, for the calibration mark groups 24a and 25a, as shown in FIG. 2A, a calibration mark (Y mark) 26a capable of measurement in the Y direction, and a calibration mark (X mark) 26b capable of measurement in the X direction are provided in the shown order. On the other hand, in the calibration mark groups 24b and 25b, an X mark and a Y mark are arranged in the reverse order (FIG. 2B). As described above, by arranging the X and Y marks in different order between the outer part (24a and 25a) and the inner part (24b and 25b) of the reticle, high-precision and high-throughput measurement of calibration marks can be achieved.

Next, the advantage of this arrangement will be described in detail. As described above, in the twin stage type exposure apparatus, it is necessary to perform high-speed measurement of the positions of calibration marks including the rotation component of the wafer stage 8. In order to measure the rotation component, it is necessary to measure Y marks disposed in at least two places on the reticle 2 and capable of measurement in the Y direction. In addition, in consideration of measuring and correcting the magnification error component of the projection optical system 3 for each wafer, it is necessary to measure two X marks disposed in two places and capable of measurement in the X direction. That is to say, in order to measure the rotation component of the wafer stage 8 and the magnification component of the projection optical system 3, it is necessary to measure four marks in total, two X marks and two Y marks. Therefore, in consideration of throughput, a configuration is necessary in which four marks are simultaneously measured in every measurement. In addition, the four photoelectric conversion elements used for the measurement need to be able to separately detect light beams simultaneously coming through the four marks.

Figure 3A:
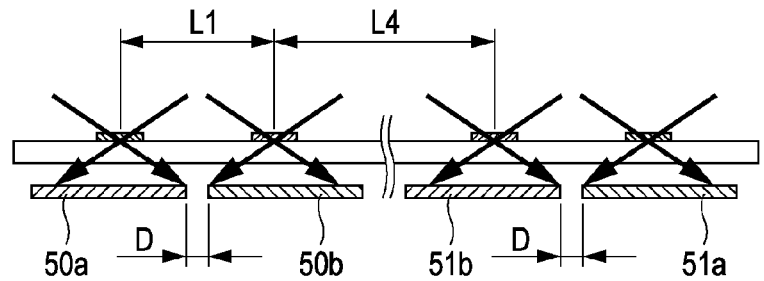
FIG. 3A is a side view of example fiducial marks and photoelectric conversion elements, according to an aspect of the present invention.

Next, the fiducial mark group 15 will be described. FIG. 3A schematically shows the fiducial mark group 15 viewed from the cross-sectional direction, and four photoelectric conversion elements 50a, 50b, 51a, and 51b corresponding to the calibration mark groups 24a and 24b. In consideration of the measurement precision of the above-described rotation component and magnification component, the distance between two marks should be as large as possible. However, in consideration of the effective region of the projection optical system 3, the distance is limited. For the performance of the projection optical system 3, it is desired that the NA on the wafer side be as large as possible. However, with the increase of the NA, the size of the photoelectric conversion elements 50a and 50b themselves increase. In addition, since the space D between the photoelectric conversion elements 50a and 50b is necessary, the distance L1 between an X mark and a Y mark adjacent thereto inevitably increases. The increase in the distance L1 is contrary to the above-described desire to increase the distance between X marks and the distance between Y marks. This dilemma can be solved by the above-described arrangement of the calibration mark groups 24a and 24b.

In the case of the twin stage type exposure apparatus, the rotation component of the wafer stage 8 is desired to be measured and corrected as accurate as possible for every wafer. Therefore, in every measurement of the calibration marks, it is effective in terms of precision to measure the Y marks for measuring the rotation component in the mark groups 24a, and to measure the X marks for measuring the magnification component in the mark groups 24b. The measurement method on such conditions will be described, comparing the measurement in the mark arrangement according to the conventional art with the measurement in the mark arrangement according to this embodiment.

Figure 11A:
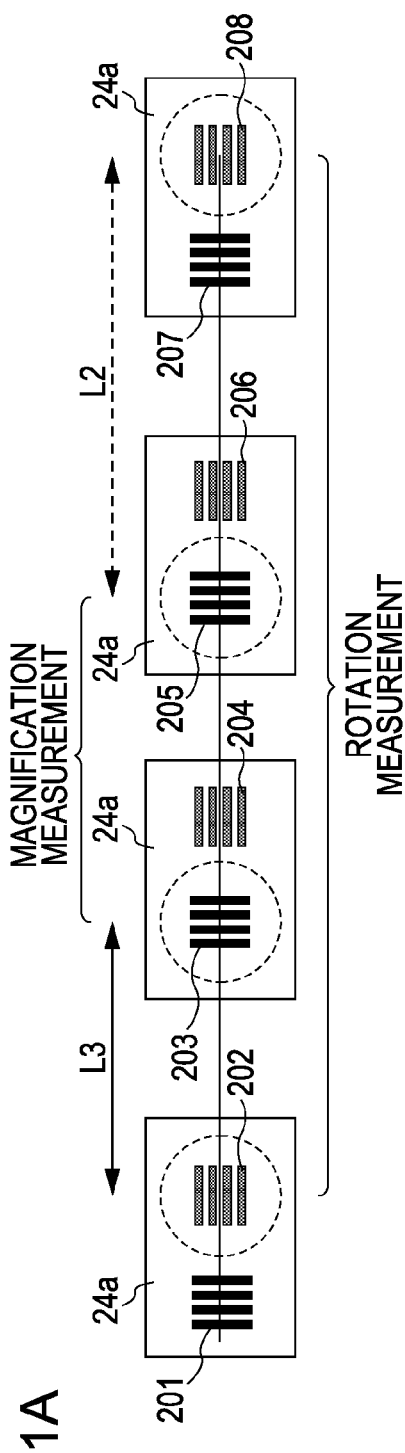
FIGS. 11A and 11B show an example arrangement of calibration marks, according to an aspect of the present invention.
Figure 11B:
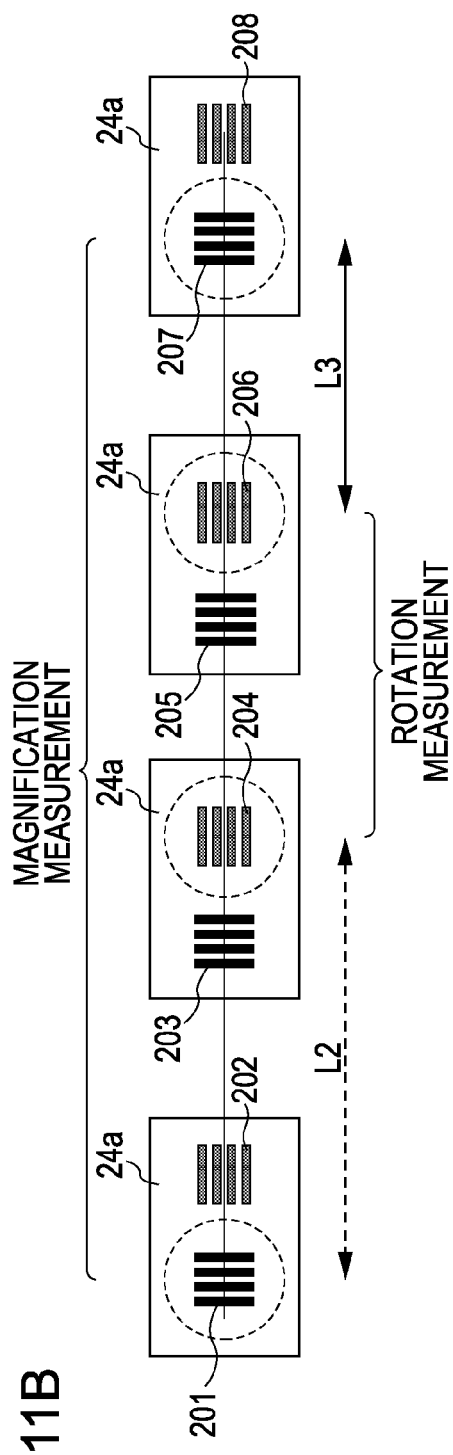
Figure 12A:
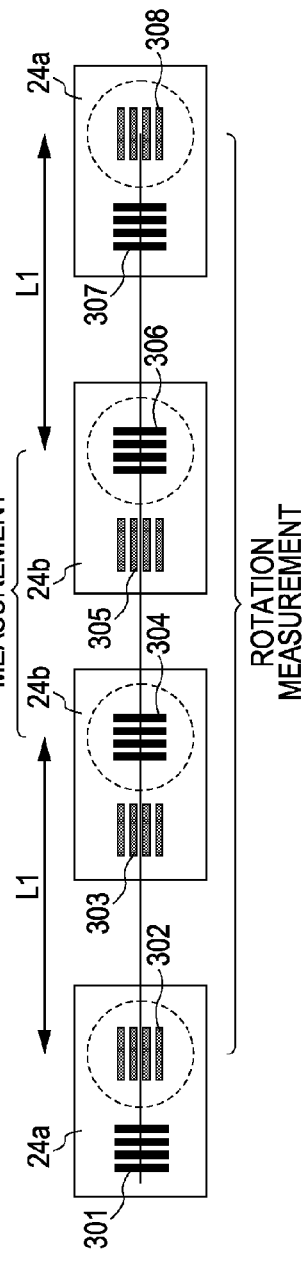
FIGS. 12A and 12B show another example arrangement of calibration marks, according to an aspect of the present invention.
Figure 12B:
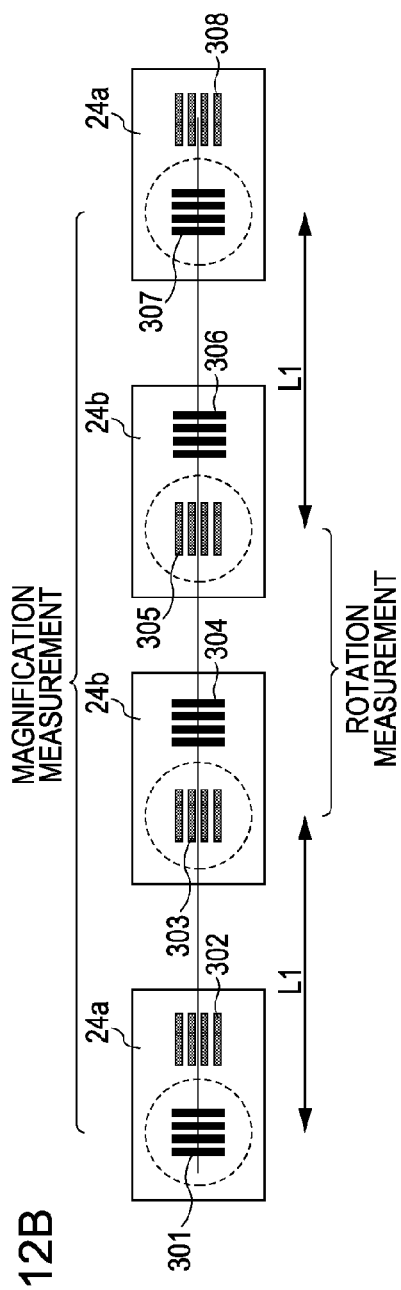
Figure 13A:
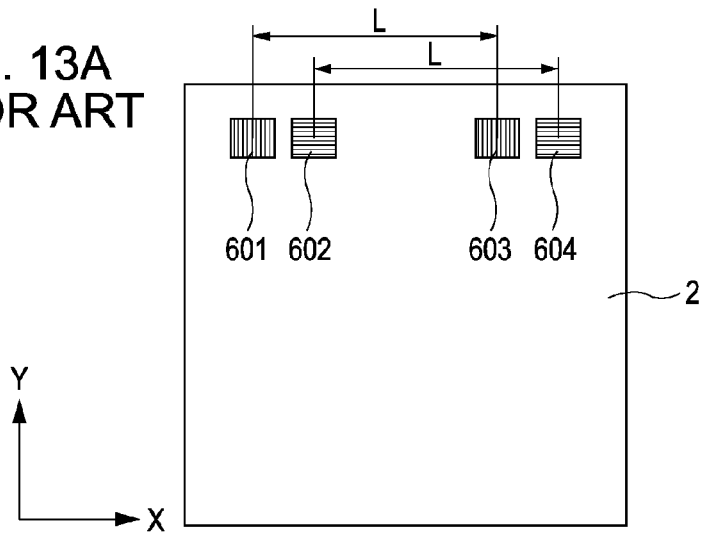
FIG. 13A is a top plan view of calibration marks according to a conventional art.
Figure 13B:
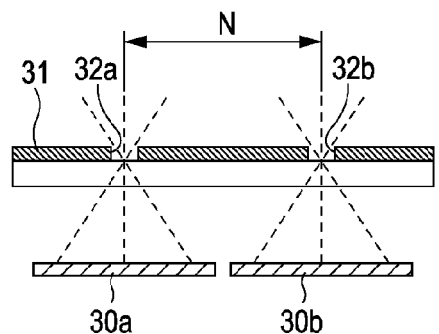
FIG. 13B is a side view of fiducial marks and photoelectric conversion elements according to the conventional art.
Figure 13C:
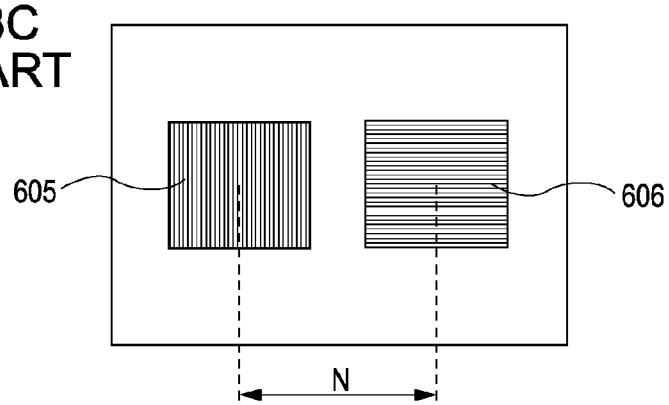
FIG. 13C is a top plan view of the fiducial marks according to the conventional art.

In FIGS. 11A and 11b, the mark groups at all image heights are in the same direction. On the other hand, in FIGS. 12A and 12B, calibration mark groups 24a, 24b, 24b, and 24a are disposed at each image height. The arrangement order of the X mark and the Y mark in the mark groups 24b is the reverse of that in the mark groups 24a. In FIGS. 11A, 11B, 12A, and 12B, marks used for measurement in four places are surrounded by dotted circles. FIGS. 11A and 12A show the methods for precisely performing the measurement of the rotation component (rotation measurement) under each condition. That is to say, they show the case where the distance between Y marks is maximized in order to precisely measure the rotation component using the difference between measurement values of the Y marks. On the other hand, FIGS. 11B and 12B show how to use the marks to precisely perform the measurement of the magnification component (magnification measurement). Since the magnification component is calculated from the measurement value in the X direction, the distance between X marks is maximized. In FIG. 11A, in order to measure the rotation component with high precision, measurement is performed using the outer Y marks 202 and 208 and the inner X marks 203 and 205. In the twin stage type exposure apparatus, it is necessary to measure the rotation component of the wafer stage with high precision for every wafer. Therefore, measurement is performed with the distance between Y marks large as described above. On the other hand, in the case where the magnification component is desired to be measured with high precision, as shown in FIG. 11B, measurement is performed using the outer X marks 201 and 207 and the inner Y marks 204 and 206. By increasing the distance between X marks, high-precision measurement can be performed.

It is to be noted that changing the method for extracting X and Y marks as described above causes the change in the distance between adjacent marks used for measurement. In FIG. 11A, the distance L3 between the Y mark 202 and the X mark 203 is different from the distance L2 between the X mark 205 and the Y mark 208 when the calibration mark groups 24a are provided symmetrically with respect to the Y axis as shown in FIG. 1. In addition, in the case of the high-precision measurement of the magnification component, the distance L2 between the X mark 201 and the Y mark 204 is different from the distance L3 between the Y mark 206 and the X mark 207. That is to say, the distance between adjacent marks used for measurement in the case of the high-precision measurement of the rotation component is different from that in the case of the high-precision measurement of the magnification component. The arrangement condition of the fiducial marks corresponding to the calibration marks on the reticle 2 will be described.

Figure 7:
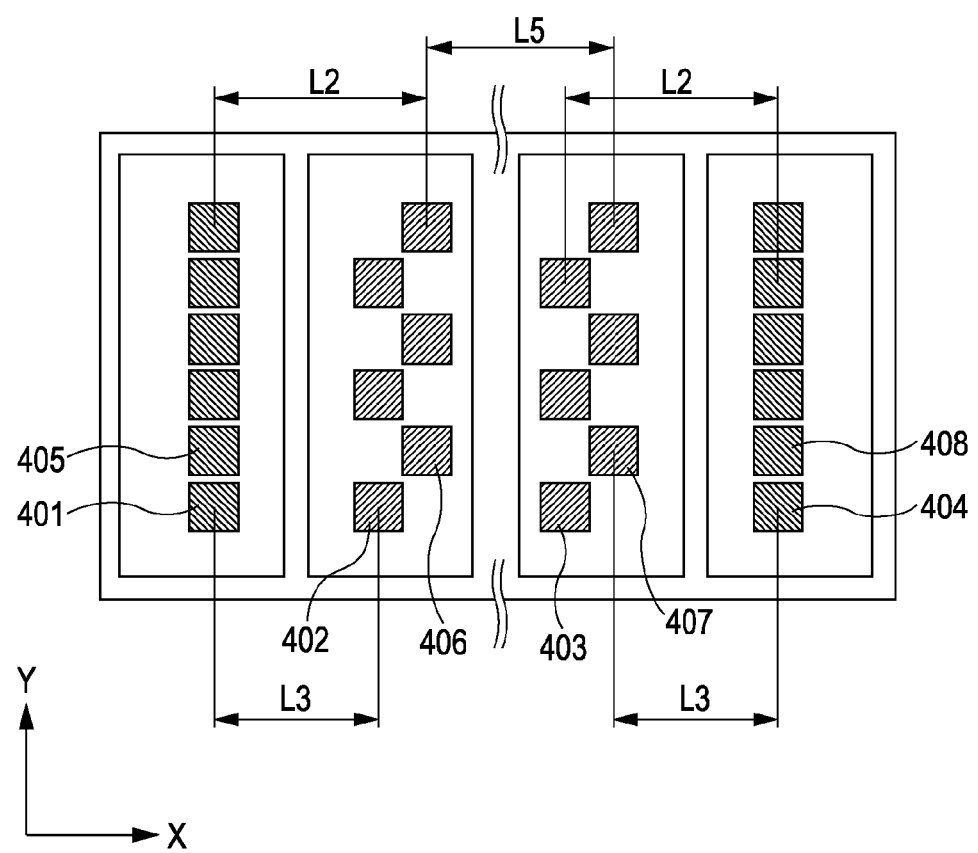
FIG. 7 is a top plan view of fiducial marks, according to an aspect of the present invention.

FIG. 7 shows the fiducial mark group 15 viewed from the Z direction. The shaded regions are fiducial marks. The fiducial marks 401 to 408 correspond to the marks 201 to 208 on the reticle 2. In the fiducial mark group 15 are prepared a plurality of fiducial marks in the direction of the Y axis. The reason is that an X mark and a Y mark are arranged in the Y direction. Separately from the fiducial marks 401 to 408, backups are prepared for the case where the fiducial marks 401 to 408 become unusable due to contamination or deterioration in transmittance of the glass. In addition to the marks along the X and Y axes, a plurality of marks capable of measurement in the direction of 45° or 135° are arranged in the Y direction. The marks can be arranged in the Y direction because, in principle, it is only necessary to elongate the photoelectric conversion elements 30 in the Y direction. As for the X direction, since the distance between fiducial marks is limited as described above, the above-described configuration is adopted. For example, the fiducial marks 401, 402, 403, 404 correspond to the calibration marks 202, 203, 205, and 208, respectively, in FIGS. 11A and 11B, and these can be simultaneously taken in. In the case where the positions of the X mark and the Y mark are detected by the above-described scanning method, by driving the stage in the direction of 45° with respect to the XY orthogonal directions, the light-amount change curve shown in FIG. 10 can be obtained in both the X and Y marks.

On the other hand, in the case of the measurement of the magnification component, the fiducial marks 405, 406, 407, and 408 correspond to the calibration marks 201, 204, 206, and 207, respectively, in FIGS. 11A and 11B. However, if the marks are disposed and selected in this way, the distances L2 and L3 between the marks are different as described above.

In contrast, in the arrangement shown in FIGS. 12A and 12B, the distance between the marks is a fixed value L1 both in the case of the high-precision measurement of the rotation component and in the case of the high-precision measurement of the magnification component.

Figure 3B:
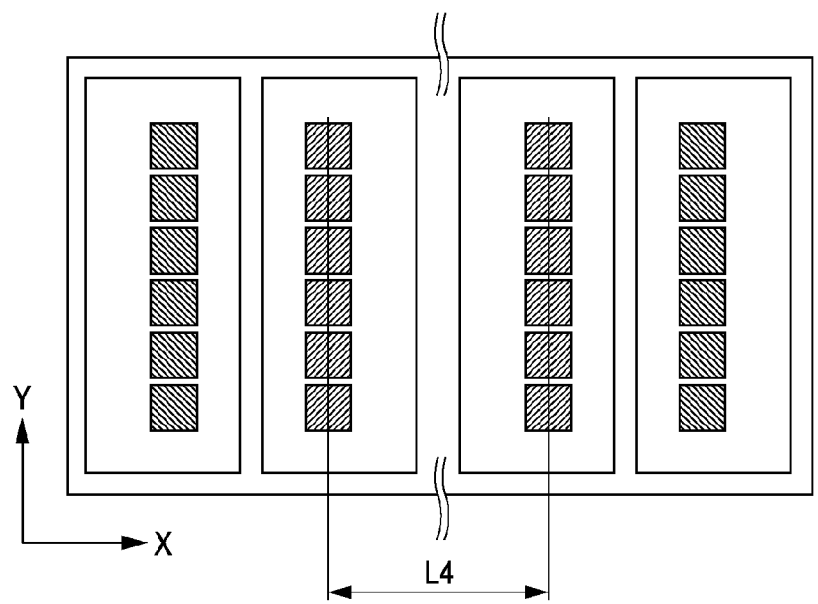
FIG. 3B is a top plan view of an example fiducial mark, according to an aspect of the present invention.

The minimum distance between the fiducial marks on the fiducial mark group 15 is determined by the distance D between the photoelectric conversion elements, that is to say, the size of the photoelectric conversion elements. Therefore, the distance L5 between the inner marks of the detection-side configuration (FIG. 7) corresponding to the arrangement shown in FIGS. 11A and 11B is smaller than the distance L4 between the inner marks of the detection-side configuration (FIG. 3B) corresponding to the arrangement shown in FIGS. 12A and 12B. This means that the distance between the marks in the case of the calculation of the rotation component or the magnification component is smaller and the measurement precision is correspondingly lower. Therefore, the arrangement shown in FIG. 12A enables more precise measurement.

The arrangement shown in FIG. 12A has the above-described advantages, whereas the arrangement shown in FIG. 11A has advantages in terms of throughput. From the viewpoint of improving throughput, it is effective to dispose, in three or preferably four or more places on the reticle, mark groups including an X mark capable of measuring the X direction and a Y mark capable of measuring the Y direction. If a fiducial mark group 15 capable of simultaneously detecting two X marks and two Y marks are provided, and selection and measurement is performed according to the desired measurement component (rotation or magnification), high-precision and high-throughput measurement is possible.

As described above, the marks should be arranged so that the arrangement of the marks on the reticle 2 is the same as that of the marks on the fiducial mark group 15. Next, how the detection is performed will be described.

The detection of the marks disposed in four places can be achieved by separately detecting the electric signals from the photoelectric conversion elements corresponding to the marks. In order to simultaneously obtain the output value change shown in FIG. 10 with respect to the X mark and the Y mark, the relative positional relationship between the reticle 2 and the fiducial mark is changed in a direction at a 45° angle to the X and Y marks. Strictly speaking, the peak positions of the output values shown in FIG. 10 are different among the photoelectric conversion elements corresponding to the marks. However, it can be said that the simultaneous intake is possible in the sense that the change curves are obtained simultaneously. Also in the measurement in the Z direction, if the photoelectric conversion elements in four places separately take in signals, a single relative positional change in the Z direction suffices for obtaining the peak shown in FIG. 10. Also in this case, strictly speaking, the obtained peak positions are different among the photoelectric conversion elements corresponding to the marks. However, it can be said that the simultaneous measurement is possible in the sense that the peaks are obtained in the same stage driving.

Although the above description is made about how to select the mark groups disposed in four places, advantages can be obtained by disposing the mark groups in at least three places. For example, two mark groups (corresponding to the mark groups 24a in FIG. 1) are disposed on the left and right of the reticle 2 and another mark group is disposed at the midpoint between the mark groups. In such a case, the rotation component can be measured but the magnification component cannot be measured simultaneously. Alternatively, the magnification component can be measured but the rotation component cannot be measured simultaneously. However, if the exposure apparatus does not require the simultaneous measurement, such a configuration is possible. What is required in this embodiment is that the X mark and the Y mark are selectable.

The above description is made about how to use the marks when attention is paid to the rotation component and when attention is paid to the magnification component. Next, more detailed embodiment will be described.

As described above, for the twin stage type exposure apparatus, it is important to measure the rotation component for every wafer. It has been known that the optical performance of the projection optical system 3 changes due to the heat generated by the exposure. In particular, the projection magnification and the focus position (astigmatism and curvature of field) of the projection optical system 3 change. In addition, since the reticle 2 absorbs the exposure light, expansion and contraction of the pattern of the reticle 2 occur due to the heat, and consequently the magnification component and the distortional component change. These changes are significant in the early stage in which the exposure is started with the projection optical system 3 cool. That is to say, at the start of the exposure, in order to measure the magnification component with high precision, the measurement in which the marks shown in FIG. 11B or 12B are selected is also performed. If the rotation component is also necessary, the marks shown in FIG. 11A or 12A are selected and the measurement is performed. If the projection optical system 3 becomes thermally stable, only the marks for measuring the rotation component are selected and the measurement is performed.

Also in the case of the measurement of the change in focus position, it is effective to select the marks according to the thermal condition of the projection optical system. Aberrations such as astigmatism and curvature of field can be measured with high precision due to the focus position information in the X direction and the Y direction at a plurality of image heights in the exposure region. That is to say, due to the focus position information of the marks 201 to 208 (or 301 to 308), these aberrations can be calculated with high precision. These aberrations also change rapidly in the early stage in which the exposure is started with the projection optical system cool. Therefore, in the early stage in which the exposure is started, both measurements of FIGS. 11A and 11B (or FIGS. 12A and 12B) are performed. When the projection optical system becomes thermally stable, only one of the measurements is performed. Since the marks are selected and measured according to the thermal condition of the exposure apparatus, it is possible to perform the measurement with emphasis on a necessary component without reducing throughput.

Second Exemplary Embodiment

Attention will now be returned to FIG. 1, and another method for selecting marks will be described. On the reticle 2 are provided mark groups in two places in the Y direction (mark groups 24 and mark groups 25). When the reticle 2 is brought in the exposure apparatus, it is necessary to minimize the rotation component of the reticle 2 relative to the Y direction (scanning direction) of the reticle stage 19 or to detect the rotation component with high precision.

The reticle stage 19 is driven in the Y direction so that the calibration mark groups 24 on the reticle 2 are disposed in the exposure region of the projection optical system 3. Thereafter, the marks shown in FIG. 11A (or FIG. 12A) are measured. That is to say, a measurement is performed in which the distance between the Y direction marks is large. Immediately after completion of the measurement, the reticle stage 19 is driven in the Y direction to move the calibration mark groups 25 into the exposure region. The above-described mark measurement is performed with respect to the calibration mark groups 25. For the calibration mark groups 25, the marks shown in FIG. 11B (or FIG. 12B) are selected and measured. The rotation component of the reticle 2 relative to the scanning direction of the reticle stage 19 can be calculated from the measurement value of the X mark obtained from the calibration mark groups 24 and the measurement value of the X mark obtained from the calibration mark groups 25. When the distance between the calibration mark groups 24 and the calibration mark groups 25 in the Y direction is Ly, the X measurement value of the calibration mark groups 24 is X(24), and the X measurement value of the calibration mark groups 25 is X(25), the rotation component θr of the reticle relative to the scanning direction is obtained from the following formula:

$$\theta r = (X(24) - X(25))/Ly$$

What is important is that the marks selected in the calibration mark groups 24 are different from the marks selected in the calibration mark groups 25. Just after the reticle is placed in the exposure apparatus, it is necessary to measure the mark groups in two places in the Y direction of the reticle 2 (mark groups 24 and mark groups 25). At that time, it is possible to select the marks with which the magnification component and other aberration components can be obtained with high precision. Therefore, high-precision measurement is achieved substantially without reducing throughput. The distance between the X marks (in the calibration mark groups 24b) is not important for calculating the rotation component θr. It can be calculated from the average of the measurement values of two X marks in the calibration mark groups 24 and the average of the measurement values of two X marks in the calibration mark groups 25.

The above description is made about the measurement values in the X and Y directions. However, the measurement in the optical axis direction can also be possible. By measuring the mark groups 24 and the mark groups 25 using the measurement method shown in FIGS. 11A and 11B (or FIGS. 12A and 12B), the aberration components in the optical axis direction (astigmatism and curvature of field) of the projection optical system 3 described in the first embodiment can be measured at the same image height. In particular, since both the X mark and the Y mark can obtain the focus measurement value at the same image height in the X direction, the astigmatism can be measured with high precision. The marks 201 and 202 in FIG. 11A (or the marks 301 and 302 in FIG. 12A) are disposed sufficiently close to each other compared to the mark groups disposed in four places, and can be deemed to be at the same image height. Alternatively, if the reticle stage 19 is driven in the X direction by the distance between the marks 201 and 202 and thereafter the measurement is performed, the marks can be deemed to be at exactly the same image height.

Third Exemplary Embodiment

Figure 9:
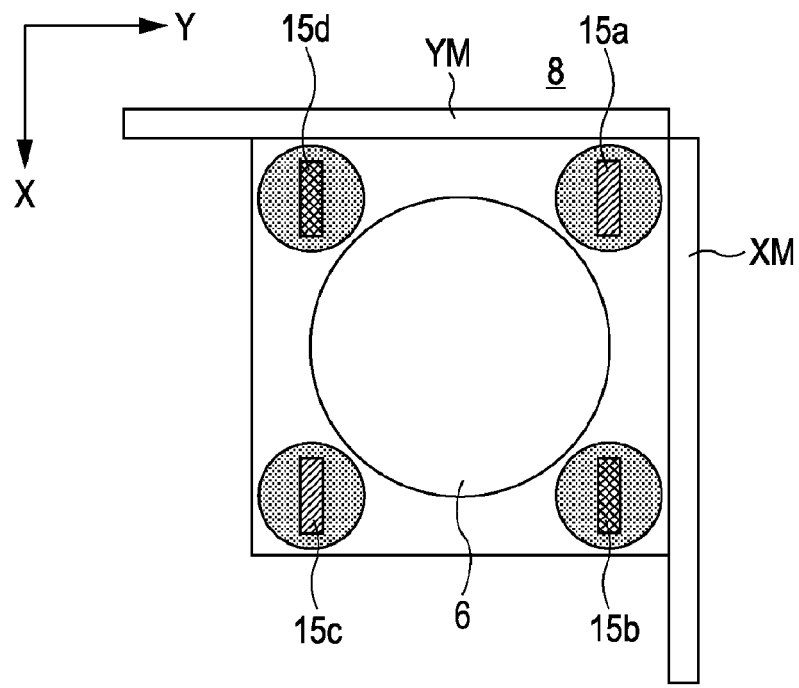
FIG. 9 is a top plan view of a wafer stage, according to an aspect of the present invention.

A third embodiment of the present invention will be described with reference to FIG. 9. FIG. 9 schematically shows the wafer stage 8 viewed from the Z direction (the optical axis direction of the projection optical system 3). On the wafer stage 8, around the portion where the wafer 6 is placed are provided fiducial mark groups 15a to 15d. In the fiducial mark groups 15a to 15d are provided the same fiducial marks and photoelectric conversion elements as those described in the first embodiment (those shown in FIGS. 3A and 3B or FIG. 7). With any one the fiducial mark groups 15a to 15d, the same measurement can be performed.

Mirrors XM and YM for measuring the position of the wafer stage 8 with an interferometer are provided in the X and Y directions, respectively. The point to which attention should be paid is that the fiducial mark groups are provided in four (essentially at least two) places. The reason for providing the plurality of fiducial mark groups is to perform the measurement for controlling the driving direction of the wafer stage 8 relative to the scanning direction of the reticle stage 19.

In the second embodiment, the calibration mark groups 24 (24a, 24b) and 25 (25a, 25b) on the reticle 2 are measured just after the reticle 2 is placed in the exposure apparatus. The feature of this embodiment is how to use the fiducial mark groups 15 when the calibration mark groups 24 and 25 are measured.

For example, when the calibration mark groups 24 are XY-measured, the marks shown in FIG. 11A (or FIG. 12A) are XY-measured with the fiducial mark group 15a. When the calibration mark groups 25 are XY-measured, the marks shown in FIG. 11B (or FIG. 12B) are XY-measured with the fiducial mark group 15b.

As described in the second embodiment, since the calibration mark groups 24 and 25 are measured, the rotation component of the reticle 2 and the magnification component of the projection optical system 3 can be measured with high precision. In addition, since the fiducial mark groups 15a and 15b are measured, the moving direction when the wafer stage 8 is driven in the X direction can be measured. The fiducial mark groups 15a to 15d are used when the position of the interferometer relative to the mirrors XM and YM is known, and the position (X, Y, and rotation component) of the wafer stage 8 is indefinite.

After the fiducial mark group 15b is measured, the wafer stage 8 is driven in the Y direction, and position is measured with the fiducial mark group 15c with respect to the calibration mark groups 24 (or 25) on the reticle 2. In this case, either of the calibration mark groups 24 and 25 can be used, and any one of the methods for selecting marks (FIGS. 11A and 11B and FIGS. 12A and 12B) can be used. There is much point in detecting the position of the wafer stage 8 using the fiducial mark group 15c. That is to say, by measuring the XY position of the fiducial mark group 15c, the moving direction in the Y direction relative to the moving direction in the X direction of the wafer stage 8 can be measured. The so-called degree of perpendicularity of the XY drive can be measured.

For the degree of perpendicularity, since the measurement value in the X direction of the fiducial mark group 15c is necessary, it is possible to perform only the measurement in the X direction. When only the X direction is measured, much more improvement of the throughput can be achieved. In the measurement of the fiducial mark group 15c, obtaining the position in the Y direction has another advantage. Therefore, the Y direction can be measured as needed. That is to say, if the position of the fiducial mark group 15c is known, the driving magnification in the Y direction can be obtained from the measurement value in the Y direction of the fiducial mark group 15b, the measurement value in the Y direction of the fiducial mark group 15c, and the measurement value of the interferometer in the Y direction. The driving magnification in the X direction can be calculated using the measurement value in the X direction of the fiducial mark group 15a and the measurement value in the X direction of the fiducial mark group 15b. The fiducial mark group 15d is not necessary in principle for measuring the above components. However, for example, to improve the measurement precision, the fiducial mark group 15d can be provided and measured.

The above description is made about the measurement values in the XY directions measured using the fiducial mark groups 15a to 15c. By measuring the position in the optical axis direction, the component fluctuating in the optical axis direction when the wafer stage 8 is driven in the XY directions can be obtained. That is to say, the amount of fluctuation in the optical axis direction when the wafer stage 8 is driven in the X direction can be measured from the difference between the measurement value in the optical axis direction of the fiducial mark group 15a and the measurement value in the optical axis direction of the fiducial mark group 15b. In addition, the amount of fluctuation in the optical axis direction when the wafer stage 8 is driven in the Y direction can be measured from the difference between the measurement value in the optical axis direction of the fiducial mark group 15b and the measurement value in the optical axis direction of the fiducial mark group 15c. As described above, if the amounts of fluctuation in the optical axis direction when the wafer stage 8 is driven in the X and Y directions are measured, the driving direction can be corrected based on the measurement results. By appropriately interweaving the selection of the marks (FIGS. 11A and 11B and FIGS. 12A and 12B) with the measurement of the fiducial mark groups 15a to 15c, the aberration component in the optical axis direction described in the second embodiment can be measured with high precision.

Although the above description is made about the method for selecting marks with respect to the fiducial mark groups 15a to 15c, the present invention is not limited to this. The order of measurement is not important.

In the above embodiments, the number of the calibration marks provided on the reticle or at equivalent positions is larger than that in the conventional configuration. In addition, the relative positions of the calibration marks are detected with the fiducial marks provided on the wafer side and capable of simultaneously measuring the calibration marks. By devising the arrangement of the calibration marks, selecting an appropriate measurement mark from each mark group, and measuring the selected marks, it is possible to provide an exposure apparatus capable of high-precision and high-throughput detection.

Fourth Exemplary Embodiment

Next, a process of manufacturing devices (semiconductor devices, liquid crystal devices, and so forth) using the above-described exposure apparatus will be described.

Figure 14:
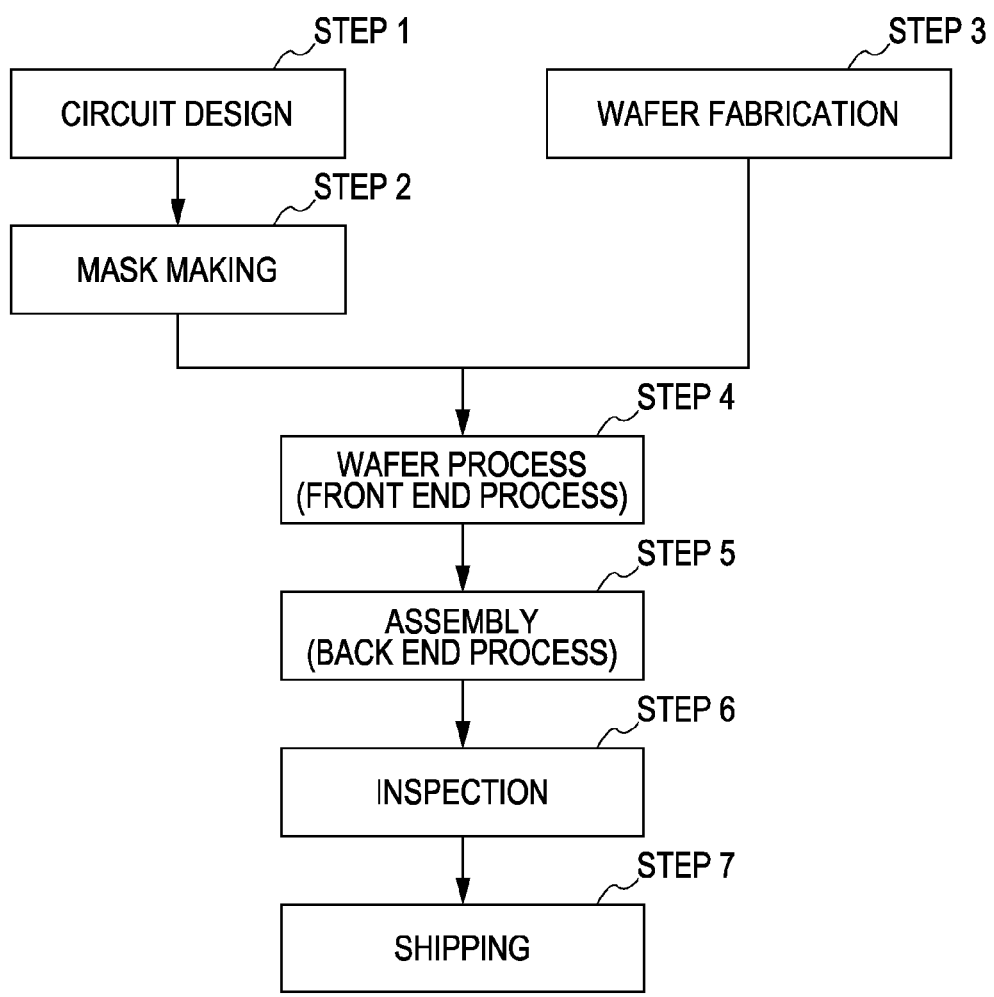
FIG. 14 is a flowchart of a device manufacturing process.

FIG. 14 shows an exemplary flow for manufacturing of semiconductor devices. In step 1 (circuit design), a semiconductor device circuit is designed. In step 2 (reticle making), a reticle having the designed pattern is made. In step 3 (wafer fabrication), wafers are fabricated using a material such as silicon. Step 4 (wafer process) is called a front end process. In step 4, actual circuits are formed on the wafers by lithography using an exposure apparatus in which the reticle is placed.

Step 5 (assembly) is called a back end process. In step 5, semiconductor chips are made of the wafers processed in step 4. The back end process includes an assembly process (dicing and bonding) and a packaging process (chip encapsulation).

In step 6 (inspection), inspections such as an operation confirmation test and a durability test of the semiconductor devices made in step 5 are conducted. Through this process, the semiconductor devices are completed, and shipped in step 7.

The wafer process of step 4 includes the following steps. An oxidation step in which the surface of a wafer is oxidized. A CVD step in which an insulating film is formed on the wafer surface. An electrode formation step in which electrodes are formed on the wafer by vapor deposition. An ion implantation step in which ions are implanted in the wafer. A resist process step in which a photosensitive material is applied to the wafer. An exposure step in which the circuit pattern of the reticle is transferred to the wafer with the exposure apparatus. A development step in which the exposed wafer is developed. An etching step in which the wafer is etched except for the developed resist image. A resist stripping step in which the resist is removed. By repeatedly performing these steps, multilayer circuit patterns are formed on the wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-230617 filed Aug. 28, 2006, which is hereby incorporated by reference herein in its entirety.

What is claimed is:

1. An exposure apparatus comprising:
a projection optical system configured to project a pattern image of an original onto a substrate;
an original stage configured to hold and drive the original;
a substrate stage configured to hold and drive the substrate; and
a position detecting system including a plurality of photoelectric conversion elements configured to detect the relative position between position detection marks formed on the original or the original stage and fiducial marks formed on the substrate stage,
wherein the relative position is a position in a direction perpendicular to an optical axis of the projection optical system,
wherein the position detection marks form a plurality of mark groups arranged along a first direction, each of the plurality of mark groups including a first mark for measuring the position in the first direction and a second mark for measuring the position in a second direction perpendicular to the first direction, and the first mark and the second mark of each of the plurality of mark groups are arranged along the first direction, and
wherein the plurality of photoelectric conversion elements simultaneously detect a plurality of marks from the plurality of mark groups such that only one mark is detected from each of the mark groups, and two first marks with the largest distance therebetween are detected from a plurality of the first marks in a first case and two second marks with the largest distance therebetween are detected from a plurality of the second marks in a second case.

2. The exposure apparatus according to claim 1,
wherein the plurality of mark groups include three mark groups, and
wherein the first mark and the second mark of each of the three mark groups are arranged in a same order.

3. The exposure apparatus according to claim 2,
wherein the plurality of photoelectric conversion elements include three photoelectric conversion elements, and
wherein the three photoelectric conversion elements simultaneously detect the first mark of each of two of the three mark groups and the second mark of the other mark group.

4. The exposure apparatus according to claim 2,
wherein the plurality of photoelectric conversion elements include three photoelectric conversion elements, and
wherein the three photoelectric conversion elements simultaneously detect the second mark of each of two of the three mark groups and the first mark of the other mark group.

5. The exposure apparatus according to claim 1,
wherein the plurality of mark groups include two first mark groups in which the first mark and the second mark are arranged in a predetermined order and two second mark groups in which the first mark and the second mark are arranged in the reverse order of the predetermined order.

6. The exposure apparatus according to claim 5,
wherein the plurality of photoelectric conversion elements include four photoelectric conversion elements, and
wherein the four photoelectric conversion elements simultaneously detect the first mark of each of the two first mark groups and the second mark of each of the two second mark groups.

7. A device manufacturing method for an exposure apparatus which includes,
a projection optical system configured to project a pattern image of an original onto a substrate;
an original stage configured to hold and drive the original;
a substrate stage configured to hold and drive the substrate; and
a position detecting system including a plurality of photoelectric conversion elements configured to detect the relative position between position detection marks formed on the original or the original stage and fiducial marks formed on the substrate stage,
wherein the relative position is a position in a direction perpendicular to an optical axis of the projection optical system
wherein the position detection marks form a plurality of mark groups arranged along a first direction, each of the plurality of mark groups including a first mark for measuring the position in the first direction and a second mark for measuring the position in a second direction perpendicular to the first direction, and the first mark and the second mark of each of the plurality of mark groups are arranged along the first direction, and
wherein the plurality of photoelectric conversion elements simultaneously detect a plurality of marks from the plurality of mark groups such that only one mark is detected from each of the mark groups, and two first marks with the largest distance therebetween are detected from a plurality of the first marks in a first case and two second marks with the largest distance therebetween are detected from a plurality of the second marks in a second case,
the method comprising:
exposing a substrate using the exposure apparatus; and
developing the exposed substrate.

* * * * *